(12) United States Patent
Ryskoski

(10) Patent No.: US 6,721,616 B1
(45) Date of Patent: Apr. 13, 2004

(54) METHOD AND APPARATUS FOR DETERMINING CONTROL ACTIONS BASED ON TOOL HEALTH AND METROLOGY DATA

(75) Inventor: Matthew S. Ryskoski, Kyle, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 46 days.

(21) Appl. No.: 10/083,887

(22) Filed: Feb. 27, 2002

(51) Int. Cl.$^7$ .............................................. G06F 19/00
(52) U.S. Cl. ....................... 700/108; 700/90; 700/109; 700/177; 700/121; 438/5; 29/563
(58) Field of Search ..................... 700/90, 108, 109, 700/110, 160, 177, 121; 438/8, 5; 29/563

(56) References Cited

U.S. PATENT DOCUMENTS

| | | | | |
|---|---|---|---|---|
| 3,819,916 A | * | 6/1974 | Watanabe | 318/565 |
| 4,894,644 A | * | 1/1990 | Thomas | 340/680 |
| 5,665,199 A | * | 9/1997 | Sahota et al. | 438/14 |
| 6,173,757 B1 | * | 1/2001 | Pohlandt | 164/456 |
| 6,230,069 B1 | * | 5/2001 | Campbell et al. | 700/121 |
| 6,368,879 B1 | * | 4/2002 | Toprac | 438/5 |
| 6,379,980 B1 | * | 4/2002 | Toprac | 438/8 |
| 6,484,064 B1 | * | 11/2002 | Campbell | 700/100 |
| 6,500,681 B1 | * | 12/2002 | Christian et al. | 438/8 |

* cited by examiner

*Primary Examiner*—Jayprakash N. Gandhi
(74) *Attorney, Agent, or Firm*—Williams, Morgan & Amerson, P.C.

(57) ABSTRACT

A method for controlling a process includes processing a first workpiece in a first process tool. An output characteristic of the first workpiece is measured. A second workpiece is processed in the first process tool. A tool health metric is determined for the first process tool corresponding to the processing of the second workpiece. A control action is determined based on the measured output characteristic and the tool health metric.

50 Claims, 4 Drawing Sheets

METHOD AND APPARATUS FOR DETERMINING CONTROL ACTIONS BASED ON TOOL HEALTH AND METROLOGY DATA

BACKGROUND OF THE INVENTION

1. Field of the Invention

This invention relates generally to the field of semiconductor device manufacturing and, more particularly, to a method and apparatus for determining control actions based on tool health and metrology data.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a group of wafers, sometimes referred to as a "lot," using a variety of processing tools, including photolithography steppers, etch tools, deposition tools, polishing tools, rapid thermal processing tools, implantation tools, etc. The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender non-optimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

One technique for improving the operation of a semiconductor processing line includes using a factory wide control system to automatically control the operation of the various processing tools. The manufacturing tools communicate with a manufacturing framework or a network of processing modules. Each manufacturing tool is generally connected to an equipment interface. The equipment interface is connected to a machine interface which facilitates communications between the manufacturing tool and the manufacturing framework. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices.

During the fabrication process various events may take place that affect the performance of the devices being fabricated. That is, variations in the fabrication process steps result in device performance variations. Factors, such as feature critical dimensions, doping levels, contact resistance, particle contamination, etc., all may potentially affect the end performance of the device. Various tools in the processing line are controlled in accordance with performance models to reduce processing variation. Commonly controlled tools include photolithography steppers, polishing tools, etching tools, and deposition tools. Pre-processing and/or post-processing metrology data is supplied to process controllers for the tools. Operating recipe parameters, such as processing time, are calculated by the process controllers based on the performance model and the metrology information to attempt to achieve post-processing results as close to a target value as possible. Reducing variation in this manner leads to increased throughput, reduced cost, higher device performance, etc., all of which equate to increased profitability.

Metrology data collected after the processing of a wafer or lot of wafers may be used to generate feedback and/or feedforward information for use in determining a control action for the previous process tool (i.e., feedback), the subsequent process tool (i.e., feedforward), or both. Typically, the output characteristics of only a sample of the wafers in a lot are measured. The sampled output characteristic data is assumed to be representative of the wafers in the lot and is used to generate the control action(s). The validity of this sampling assumption depends in part on the stability of the process used to process the lot of wafers. If not all of the wafers in the lot are processed using the same stable process, some of the wafers may have output characteristics that differ from the wafers used to generate the sampled metrology data, thus degrading the integrity of the sampling assumption. Control actions may be implemented based on metrology data that does not apply to all wafers in the lot. For example, if the metrology data is used to adjust a polishing time, and the layer being processed on one wafer has different characteristics than the process layer on the wafer that was measured, the non-measured process layer may be polished incorrectly resulting in the degradation of the process layer or damage to underlying features formed on the wafer.

The present invention is directed to overcoming, or at least reducing the effects of, one or more of the problems set forth above.

SUMMARY OF THE INVENTION

One aspect of the present invention is seen in a method for controlling a process. The method includes processing a first workpiece in a first process tool. An output characteristic of the first workpiece is measured. A second workpiece is processed in the first process tool. A tool health metric is determined for the first process tool corresponding to the processing of the second workpiece. A control action is determined based on the measured output characteristic and the tool health metric. The control action may be a feed back control action or a feedforward control action.

BRIEF DESCRIPTION OF THE DRAWINGS

The invention may be understood by reference to the following description taken in conjunction with the accompanying drawings, in which like reference numerals identify like elements, and in which.

Figure 1:
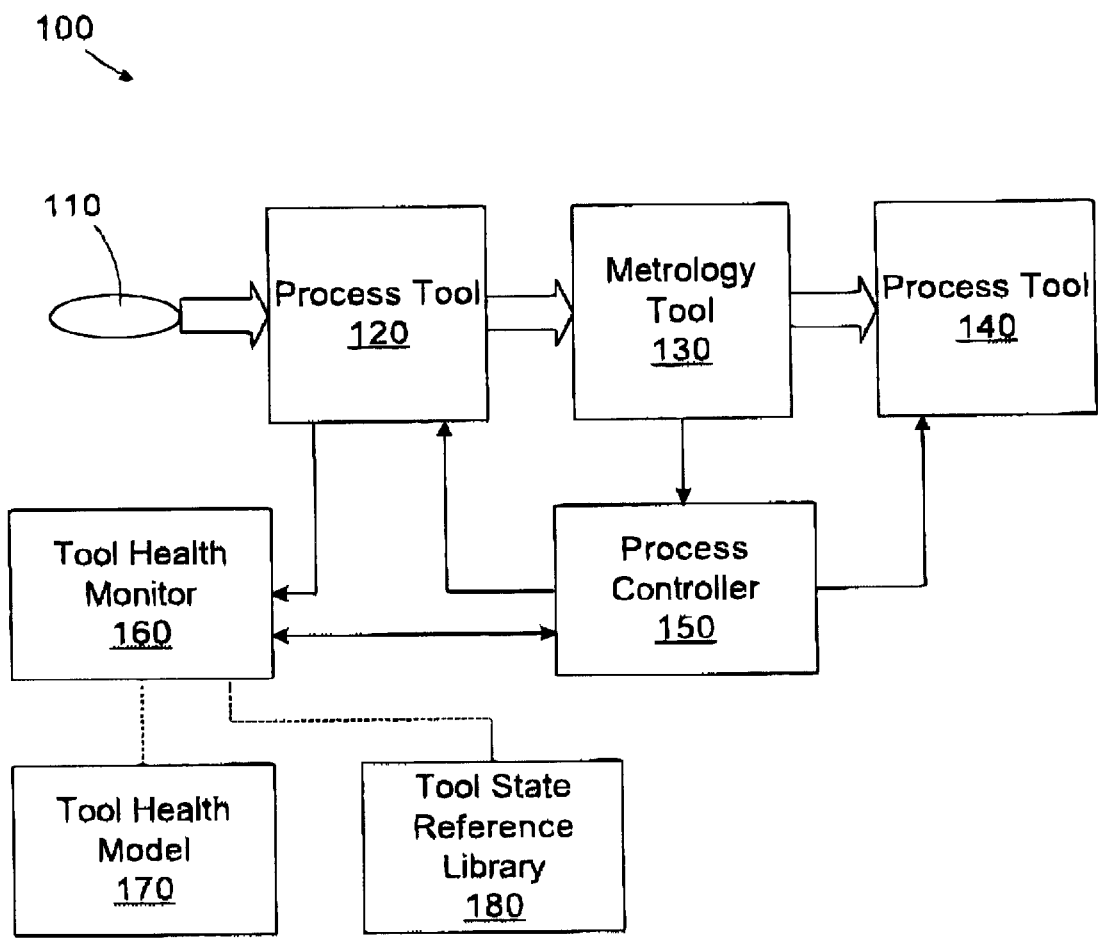
FIG. 1 is a simplified block diagram of a processing line in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to FIG. 1, a simplified diagram of a portion of an illustrative processing line 100 for processing wafers 110 in accordance with the present invention is provided. The processing line 100 includes a first process tool 120, a metrology tool 130, a second process tool 140, and a process controller 150. The process controller 150 receives data from the metrology tool 130 and adjusts the operating recipe of the one or both of the process tools 120, 140 to reduce variations in the characteristics of the processed wafers 110. The particular control actions taken by the process controller 150 depend on the particular processes performed by the process tools 120, 140, and the output characteristic measured by the metrology tool 130.

Although the invention is described as it may be implemented in a semiconductor fabrication facility, the invention is not so limited and may be applied to other manufacturing environments. The techniques described herein may be applied to a variety of workpieces including, but not limited to microprocessors, memory devices, digital signal processors, application specific integrated circuits (ASICs), or other similar devices. The techniques may also be applied to workpieces other than semiconductor devices.

The process controller 150 may use a control model of the process tool 120, 140 being controlled to generate its control action. The control model may be developed empirically using commonly known linear or non-linear techniques. The control model may be a relatively simple equation based model (e.g., linear, exponential, weighted average, etc.) or a more complex model, such as a neural network model, principal component analysis (PCA) model, partial least squares projection to latent structures (PLS) model. The specific implementation of the model may vary depending on the modeling technique selected. Using the control model, the process controller 150 may determine operating recipe parameters to reduce variation in the characteristics of the wafers 110 being processed.

In the illustrated embodiment, the process controller 150 is a computer programmed with software to implement the functions described. However, as will be appreciated by those of ordinary skill in the art, a hardware controller designed to implement the particular functions may also be used. Moreover, the functions performed by the process controller 150, as described herein, may be performed by multiple controller devices distributed throughout a system. Additionally, the process controller 150 may be a stand-alone controller, it may be resident on the etch tool 130, or it may be part of a system controlling operations in an integrated circuit manufacturing facility. Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary information exchange and process control framework suitable for use in the processing line 100 is an Advanced Process Control (APC) framework, such as may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI, which is headquartered in Mountain View, Calif.

Figure 2A:
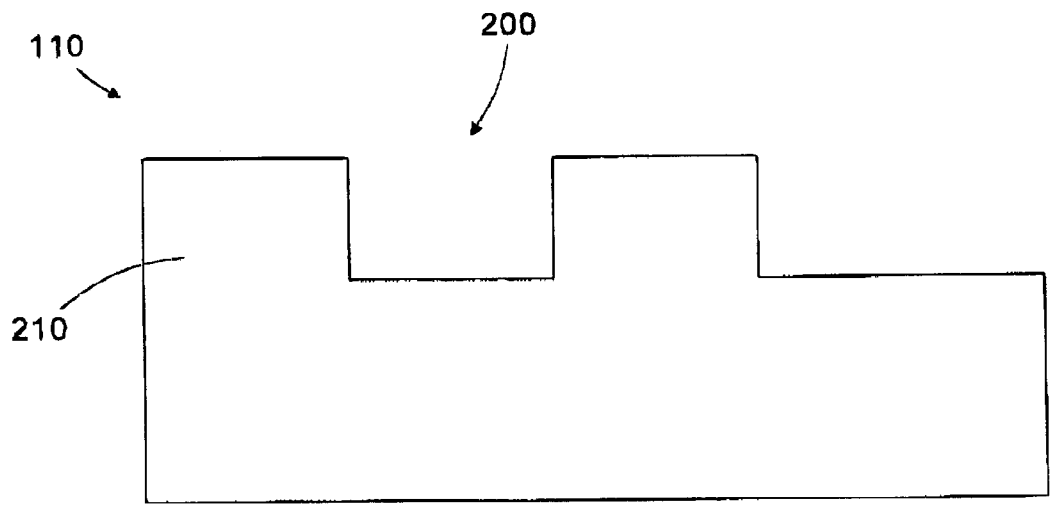
FIGS. 2A through 2C are cross-section views of an exemplary feature formed by the processing line of FIG. 1.
Figure 2B:
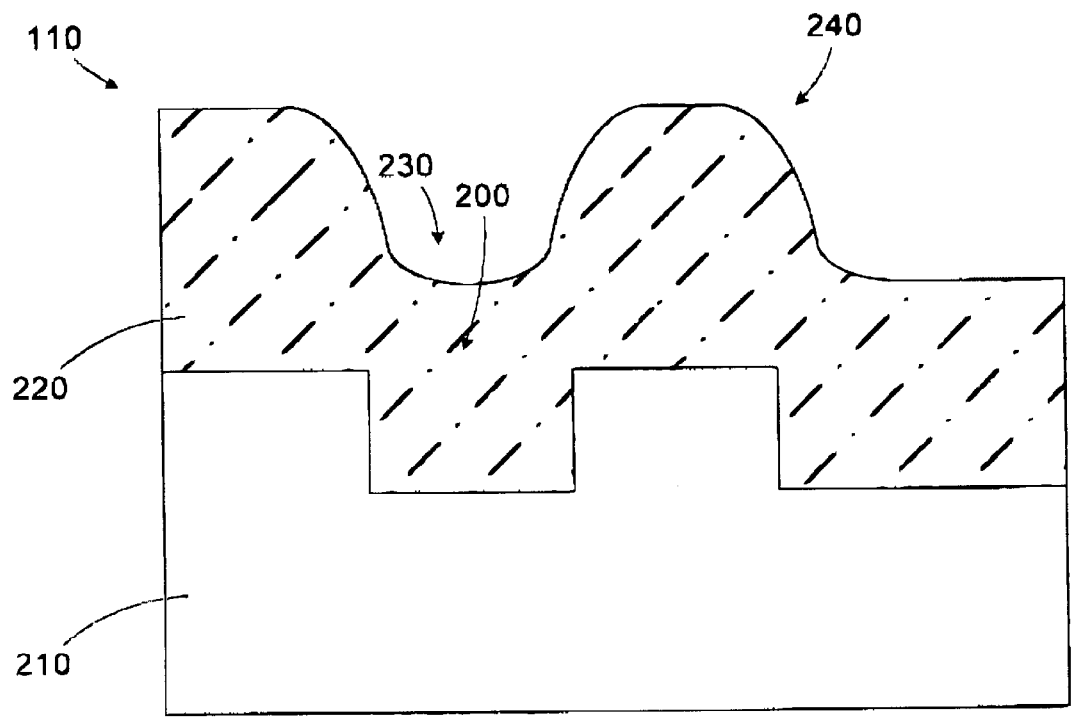
Figure 2C:
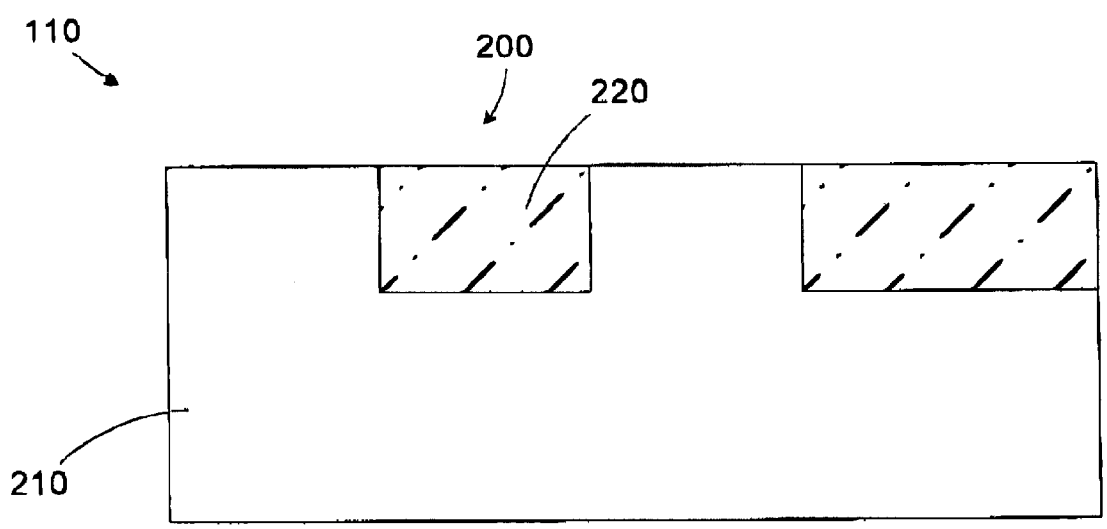

For purposes of illustration, the invention is described as it may be implemented in a portion of the process line 100 used to form shallow trench isolation (STI) features on the wafer 110, as depicted in FIGS. 2A through 2C. However, the application of the present invention is not so limited, as it may be applied to other features and to a variety of different process tools.

In this exemplary implementation, the process tool 120 is an etch tool adapted to etch trenches 200 in a substrate layer 210 of the wafer 110, as shown in FIG. 2A. A subsequent deposition tool (not shown) deposits an insulating layer 220, such as silicon dioxide, over the substrate 210 and into the trenches 200, as shown in FIG. 2B. The process tool 140 is a polishing tool adapted to remove portions of the insulating layer 220 not disposed within the trenches 200, as shown in FIG. 2C. As seen in FIG. 2B, the deposited insulating layer 220 initially conforms to the underlying trench topology, leaving low areas 230 (i.e., over the trench 200) and high areas 240 (i.e., where no trench 200 is present). The polishing process removes the high areas 240 at a higher rate than the low areas 230, thus planarizing the surface of the insulating layer 220 as shown in FIG. 2C.

Due to the flexibility of polishing pads used to polish the insulating layer 220 and the presence of isotropic etchants in the polishing slurry, some etching of the low areas 230 above the trenches 200 may occur. Variations in the depth of the trenches 200 results in corresponding variations in the height difference between the low areas 230 and high areas 240.

The process controller 150 changes the operating recipe of the process tool 140 to account for deviations in the initial trench depth. If the polishing process were not controlled based on the trench depth, overpolishing or underpolishing may occur. Overpolishing may result in the low areas 230 being polished such that a portion of the insulating material 220 within the trench 200 is undesirably removed or such that the substrate later 210 is damaged, thus interfering with the isolation function of the STI feature. Underpolishing may result in an incomplete removal of the insulating layer 220.

The metrology tool 130 measures an output characteristic of the wafers 110 (e.g., trench depth). The process controller 150 incorporates uses feedforward metrology data to generate a control action for the process tool 140 to determine an appropriate polishing time for removing the insulating layer. The process controller 150 may also use the trench depth measurement as feedback data to generate a control action for the process tool 120 to bring the depth of subsequently formed trenches closer to a target value. Although only one process controller 150 is illustrated, separate process controllers may be provided, one for the generating the feedforward control action and one for generating the feedback control action. The metrology tool 130 measures an output characteristic of only a sample of the wafers 110 processed in the process tool 120. In one embodiment, the process controller 150 may use an average of the output characteristics measured over the sample to generate its control action.

The processing line 100 also includes a tool health monitor 160 adapted to collect tool state trace data during the processing of wafers 110 in the process tool 120. The tool health monitor 160 generates tool health metrics based on the collected tool state trace data. The particular tool state information collected depends on the specific process performed by the process tool 120. For example, exemplary tool state data for an etch tool may include gas flow, chamber pressure, chamber temperature, voltage, reflected power, backside helium pressure, RF tuning parameters, etc.

The tool health monitor 160 may use the tool state trace data to identify fault conditions associated with the process tool 120. For example, if the tool state trace data is significantly different that what was expected for the operating recipe and environment of the process tool 120, a tool fault may exist. The tool health monitor 160 collects tool state trace data during processing runs of the monitored process tool 120 to determine a tool health metric for the process tool 120. One technique for monitoring the health of the process tool 120 involves employing a multivariate tool health model 170 adapted to predict the expected operating parameters of the process tool 120 during the processing run. If the actual observed tool parameters are close to the predicted tool parameters, the process tool 120 is said to have a high health metric (i.e., the process tool 120 is operating as expected). As the gap between the expected tool parameters and the observed tool parameters widens, the tool health metric decreases. For example, the tool health metric may be expressed as a percentage, with a 100% tool health value equating to a perfect match between the expected tool parameters and the observed tool parameters.

Typically, the tool health model 170 used to predict the operating parameters of the process tool 120, thereby measuring the health of the process tool 120, is based on the particular process tool 120 and the base operating recipe employed by the process tool 120 for processing the wafers. Hence, the process tool 120 may have a separate tool health model 170 for each of the base operating recipes run on the process tool 120. An exemplary tool health monitor software application is ModelWare™ offered by Triant, Inc. of Nanaimo, British Columbia, Canada Vancouver, Canada. An exemplary system for monitoring tool health is described in U.S. patent application Ser. No. 09/863,822, entitled "METHOD AND APPARATUS FOR MONITORING TOOL HEALTH," filed in the names of Elfido Coss Jr., Richard J. Markle, and Patrick M. Cowan, that is assigned to the assignee of the present application and incorporated herein by reference in its entirety.

In a fault detection mode of operation, if the tool health metric falls below a predetermined threshold, a maintenance procedure may be performed to troubleshoot or repair the process tool 120. In a process control mode of operation, described in greater detail below, the process controller 150 considers the tool health metrics generated during the processing of the wafers 110 in generating its feedback and/or feedforward control actions. In a broad sense, if the tool health metric generated during the processing of a wafer 110 that is subsequently measured by the metrology tool 130 (i.e., referred to hereinafter as a metrology wafer) is different than the tool health metric generated during the processing of a non-metrology wafer the validity of the sampling assumption (i.e., that the metrology wafer and non-metrology wafer have similar output characteristics) is reduced. As the difference between the tool health metrics for the metrology wafer and the non-metrology wafer increases, so does the expected difference in their output characteristics. If the process controller 150 were to make control decisions based solely on the data collected for the metrology wafers, the effectiveness of the control actions may be compromised in situations where the tool health metric varies across the run.

In the illustrated embodiment, the process controller 150 considers both the metrology data and the tool health metrics generated during the processing runs of the wafers 110 in generating its control actions. The particular manner in which the process controller 150 incorporates the tool health metrics may vary depending on the particular nature of the process tool 120 and the operation it performs.

In one embodiment, the process controller 150 changes the value of the measured output characteristic of the metrology wafer in accordance with an expected variation in the corresponding output characteristic of the non-metrology wafer. For example, if the trench depth for the metrology wafer is determined to be $X_1$ microns, the process controller 150 may determine an offset $X_2$ to be applied to the output characteristic value:

$$\text{Modified } OC = X_1 - X_2. \quad (1)$$

The magnitude of the offset may be determined using a control equation that incorporates the tool health metric, or alternatively, the offset may be determined using historical data collected that correlates a tool health metric deviation to the output characteristic deviation. In the illustrated embodiment, wafers having acceptable tool health metrics (e.g., 85–100%) are pre-selected as metrology wafers. If the metrology wafers were not pre-selected based on tool health metrics, metrology data collected from wafers having poor tool health metrics could be ignored by the process controller 150.

An exemplary technique that incorporates historical data to generate offset values includes the use of a tool state reference library 180. The tool state reference library 180 includes a plurality of reference sets of tool state trace data generated from previous processing runs of the process tool 120. Each trace data entry may include tool operating parameters, environmental conditions, operating recipe parameters, etc. collected during the associated processing run. The trace data entry may also include mathematically processed data, such as an average tool parameter (e.g., average temperature) or an integrated parameter (e.g., integrated voltage). Each reference trace in the tool state reference library 180 has an associated output characteristic offset. The output characteristic offsets are generated from post-processing metrology data collected for actual wafers 110 processed in the process tool 120 (e.g., previous metrology wafers). The tool state reference library 180 may; be periodically updated as additional metrology data is collected for additional wafers 110 processed in the process tool 120.

After a wafer is processed in the process tool 120, the tool health monitor 160 compares the current tool state trace data to the reference traces in the tool state reference library 180 and determines the reference trace closest to the current trace. Various techniques for matching the current trace to a reference trace are well known to those of ordinary skill in the art. For example, a minimum least squares technique may be employed. The output characteristic offset associated with the selected reference trace is provided to the process controller 150.

In another embodiment, the process controller 150 may adjust the aggressiveness associated with its control action, rather than changing the actual output characteristic, responsive to variations in the tool health metrics. For example, if the tool health metric indicates a relatively poor tool health, the process controller 150 may take a more conservative control action. The particular change to the control action to make it more conservative depends on the particular nature of the process tool 120, 140 and the process it is performing. For example in a polishing operation, a more conservative control action is to reduce the polishing time. Reducing the polishing time reduces the likelihood of an overpolishing condition from occurring that could damage the wafer being polished. If the wafer is underpolished, a subsequent polishing process can be performed to finish the polishing. Although the subsequent polishing would require the expenditure of additional resources and would add an element of delay, the integrity of the wafer could be protected.

In the context of the polishing example, an exemplary simple control equation for determining the polishing time, $T_P$, is:

$$T_P = T_B + k_1 * (\text{Target Depth} - \text{Measured Depth}), \quad (2)$$

where $T_B$ is a base polishing time corresponding to a default polishing time value, $k_1$ is a gain constant, and the difference between the target depth of the trench and the measured depth of the trench reflects an error value.

To implement the control equation more conservatively, the process controller 150 may make a variety of adjustments. First, it may simple reduce the polishing time by a predetermined factor having a magnitude dependent on the severity of the tool health metric deviation:

$$T_P = T_B + k_1 * (\text{Target Depth} - \text{Measured Depth}) - k_2. \quad (3)$$

The magnitude of the offset may have a predetermined value if the tool health metric, THM, is below a predetermined value:

$$k_2 = \begin{cases} 0 & \text{for } THM \geq TH_1 \\ C_1 & \text{for } THM < TH_1 \end{cases}, \quad (4)$$

or, alternatively, the magnitude of the offset may be proportional to the degradation in the tool health metric:

$$k_2 = \begin{cases} 0 & \text{for } THM \geq TH_1 \\ C_2 \cdot (1 - THM) & \text{for } THM < TH_1 \end{cases}. \quad (5)$$

In a second example, the process controller 150 may reduce the gain constant, $k_1$, to thereby reduce the sensitivity of the control equation:

$$T_P = T_B + (k_1 - k_3) * (\text{Target Depth} - \text{Measured Depth}), \quad (6)$$

where the magnitude of the sensitivity reduction may be a predetermined value if the tool health metric, THM, is below a predetermined value:

$$k_3 = \begin{cases} 0 & \text{for } THM \geq TH_2 \\ C_3 & \text{for } THM < TH_2 \end{cases}, \quad (7)$$

or, alternatively, the magnitude of the sensitivity reduction may be proportional to the degradation in the tool health metric:

$$k_3 = \begin{cases} 0 & \text{for } THM \geq TH_2 \\ C_4 \cdot (1 - THM) & \text{for } THM < TH_2 \end{cases}. \quad (8)$$

In a case where the tool health metric is sufficiently low, the process controller 150 may ignore the metrology data and set the polishing time to a default value:

$$T_P = T_B \text{ for } THM < TH_3. \quad (9)$$

The magnitudes of the thresholds, $TH_1$, $TH_2$, and $TH_3$, depend on the particular implementation and nature of the process tool 120, 140 and process performed. Similarly, the magnitudes of the gains constants also depend on the particular implementation.

The previous example illustrates a feedforward control example for determining the operating recipe of the process tool 140. A similar technique may be used to generate feedback control actions. For example, if the process controller 150 is generating a control action for the process tool 120 to adjust subsequent trench etch processes, the process controller may reduce the sensitivity of the control equation (e.g., by reducing the gain constant) if the tool health metric associated with the metrology wafer is less than optimal.

Although the offset and sensitivity reduction techniques described above are illustrated using simple control equations, similar techniques may be applied to more complicated control schemes with similar effect.

Figure 3:
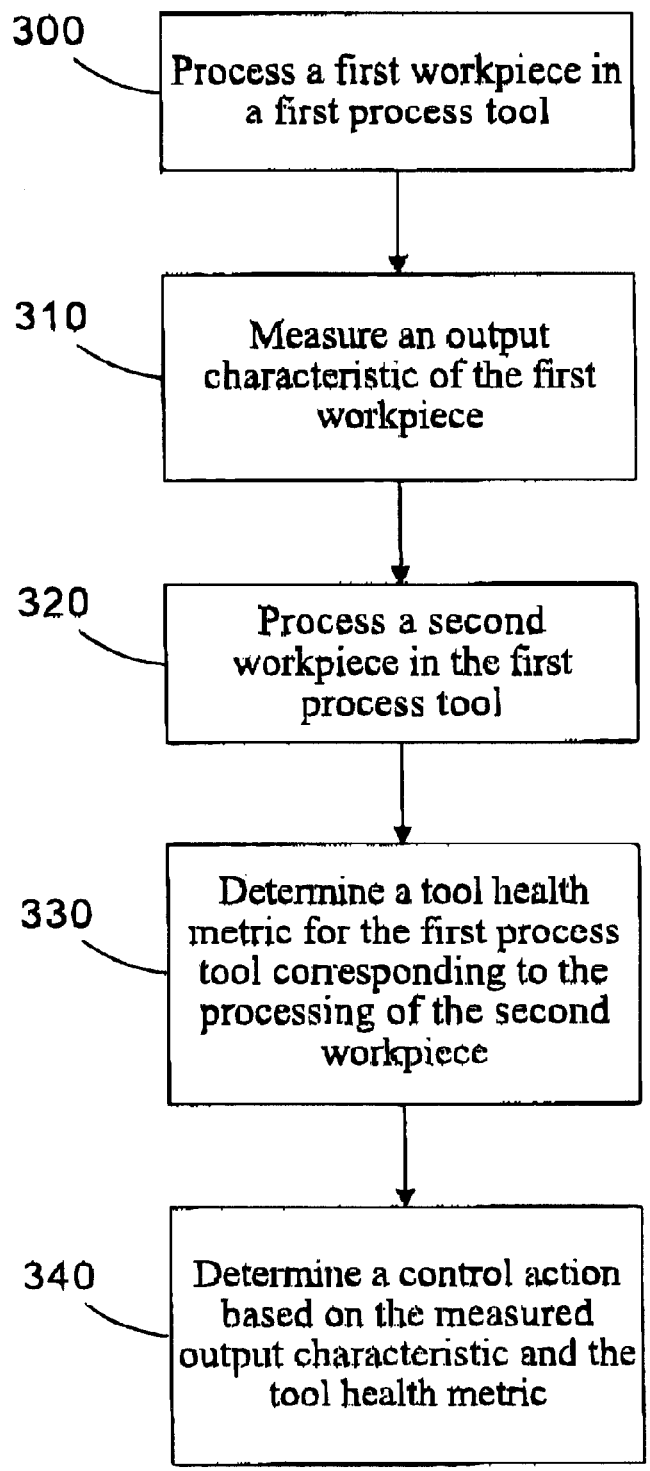
FIG. 3 is a simplified block diagram of a method for controlling a process in accordance with another illustrative embodiment of the present invention.

Turning now to FIG. 3, a simplified flow diagram of a method for determining control actions in accordance with another embodiment of the present invention is provided. In block 300, a first workpiece is processed in a first process tool. In block 310, an output characteristic of the first workpiece is measured. In block 320, a second workpiece is processed in the first process tool. In block 330, a tool health metric is determined for the first process tool corresponding to the processing of the second workpiece. In block 340, a control action for the second workpiece is determined based on the measured output characteristic and the tool health metric.

Generating control actions that incorporate metrology data and tool health data has several advantages. The difference between the processing environments of the metrology wafers and the non-metrology wafers can be accounted for in the control actions to reduce the likelihood that the process tool will be adjusted ineffectively. Output characteristic measurements can be weighted in accordance with their applicability to the control action. Where the accuracy of the sampling assumption that the metrology data is representative of all the wafers in the lot is in question, the contribution of the metrology data to the control action can be reduced or eliminated. Control actions can be made more conservative during periods of instability to reduce the likelihood of misprocessing the wafers.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for controlling a process, comprising:
    processing a first workpiece in a first process tool;
    measuring an output characteristic of the first workpiece;
    processing a second workpiece in the first process tool;
    determining a tool health metric for the first process tool corresponding to the processing of the second workpiece;
    determining a control action based on the measured output characteristic and the tool health metric.

2. The method of claim 1, wherein generating the control action further comprises generating a feedback control action for the first process tool.

3. The method of claim 2, wherein generating the feedback control action further comprises determining an operating recipe parameter of the first process tool for processing a subsequent workpiece.

4. The method of claim 1, wherein generating the control action further comprises generating a feedforward control action for a second process tool to process at least the second workpiece.

5. The method of claim 4, wherein generating the feedforward control action further comprises determining an operating recipe parameter of the second process tool for processing the second workpiece.

6. The method of claim 1, wherein generating the control action further comprises generating the control action in accordance with a control equation based on at least the measured output characteristic.

7. The method of claim 6, wherein generating the control action further comprises reducing a sensitivity of the control equation based on the tool health metric.

8. The method of claim 7, wherein reducing the sensitivity further comprises reducing a gain constant of the control equation.

9. The method of claim 7, wherein reducing the sensitivity further comprises reducing the sensitivity responsive to the tool health metric being less than a predetermined threshold.

10. The method of claim 7, wherein reducing the sensitivity further comprises reducing the sensitivity in proportion to a difference between the tool health metric and a predetermined threshold.

11. The method of claim 6, wherein generating the control action further comprises generating an offset value for the control equation based on the tool health metric.

12. The method of claim 11, wherein generating the offset value further comprises generating a predetermined offset value responsive to the tool health metric being less than a predetermined threshold.

13. The method of claim 11, wherein generating the offset value further comprises generating the offset value having a magnitude proportionate to a difference between the tool health metric and a predetermined threshold.

14. The method of claim 1, wherein generating the control action further comprises generating an offset value for the measured output characteristic based on the tool health metric.

15. The method of claim 14, wherein generating the offset value further comprises generating a predetermined offset value responsive to the tool health metric being less than a predetermined threshold.

16. The method of claim 14, wherein generating the offset value further comprises generating the offset value having a magnitude proportionate to a difference between the tool health metric and a predetermined threshold.

17. The method of claim 14, wherein generating the tool health metric further comprises:
    collecting tool state trace data during the processing of the second workpiece;
    generating the tool health metric based on the tool state trace data; and
    generating the offset value based on the tool health metric.

18. The method of claim 17, wherein generating the offset value further comprises:
    comparing the collected tool state trace data to a library of reference tool state traces, each reference tool state trace having an associated offset value;
    selecting a reference tool state trace closest to the collected tool state trace data; and
    selecting the offset value associated with the selected reference tool state trace.

19. The method of claim 5, wherein generating the control action further comprises:
    ignoring the measured output characteristic; and
    setting the operating recipe parameter to a default value.

20. A method for controlling a process, comprising:
    processing a first workpiece in a first process tool;

measuring an output characteristic of the first workpiece;
processing a second workpiece in the first process tool;
determining a tool health metric for the first process tool corresponding to the processing of the second workpiece;
determining a feedback control action for the first process tool based on the measured output characteristic and the tool health metric; and
decreasing an effect of the measured output characteristic on the feedback control action responsive to the tool health metric indicating a degraded condition of the first process tool.

21. The method of claim 20, wherein generating the feedback control action further comprises determining an operating recipe parameter of the first process tool for processing a subsequent workpiece.

22. The method of claim 20, wherein generating the feedback control action further comprises generating the feedback control action in accordance with a control equation based on at least the measured output characteristic, wherein decreasing the effect of the measured output characteristic further comprises reducing a sensitivity of the control equation based on the tool health metric.

23. The method of claim 22, wherein reducing the sensitivity further comprises reducing a gain constant of the control equation.

24. The method of claim 22, wherein reducing the sensitivity further comprises reducing the sensitivity responsive to the tool health metric being less than a predetermined threshold.

25. The method of claim 22, wherein reducing the sensitivity further comprises reducing the sensitivity in proportion to a difference between the tool health metric and a predetermined threshold.

26. The method of claim 22, wherein generating the feedback control action further comprises generating an offset value for the control equation based on the tool health metric.

27. The method of claim 26, wherein generating the offset value further comprises generating a predetermined offset value responsive to the tool health metric being less than a predetermined threshold.

28. The method of claim 26, wherein generating the offset value further comprises generating the offset value having a magnitude proportionate to a difference between the tool health metric and a predetermined threshold.

29. The method of claim 20, wherein generating the feedback control action further comprises generating an offset value for the measured output characteristic based on the tool health metric.

30. The method of claim 29, wherein generating the offset value further comprises generating a predetermined offset value responsive to the tool health metric being less than a predetermined threshold.

31. The method of claim 29, wherein generating the offset value further comprises generating the offset value having a magnitude proportionate to a difference between the tool health metric and a predetermined threshold.

32. The method of claim 29, wherein generating the tool health metric further comprises:
collecting tool state trace data during the processing of the second workpiece;
generating the tool health metric based on the tool state trace data; and
generating the offset value based on the tool health metric.

33. The method of claim 32, wherein generating the offset value further comprises:

comparing the collected tool state trace data to a library of reference tool state traces, each reference tool state trace having an associated offset value;
selecting a reference tool state trace closest to the collected tool state trace data; and
selecting the offset value associated with the selected reference tool state trace.

34. The method of claim 21, wherein generating the feedback control action further comprises:
ignoring the measured output characteristic; and
setting the operating recipe parameter to a default value.

35. A method for controlling a process, comprising:
processing a first workpiece in a first process tool;
measuring an output characteristic of the first workpiece;
processing a second workpiece in the first process tool;
determining a tool health metric for the first process tool corresponding to the processing of the second workpiece;
determining a feedforward control action for a second process tool to process at least the second workpiece based on the measured output characteristic and the tool health metric; and
decreasing an effect of the measured output characteristic on the feedforward control action responsive to the tool health metric indicating a degraded condition of the first process tool.

36. The method of claim 35, wherein generating the feedforward control action further comprises determining an operating recipe parameter of the second process tool for processing the second workpiece.

37. The method of claim 35, wherein generating the feedforward control action further comprises generating the feedforward control action in accordance with a control equation based on at least the measured output characteristic.

38. The method of claim 37, wherein decreasing the effect of the measured output characteristic further comprises reducing a sensitivity of the control equation based on the tool health metric.

39. The method of claim 38, wherein reducing the sensitivity further comprises reducing a gain constant of the control equation.

40. The method of claim 38, wherein reducing the sensitivity further comprises reducing the sensitivity responsive to the tool health metric being less than a predetermined threshold.

41. The method of claim 38, wherein reducing the sensitivity further comprises reducing the sensitivity in proportion to a difference between the tool health metric and a predetermined threshold.

42. The method of claim 37, wherein reducing the sensitivity further comprises generating an offset value for the control equation based on the tool health metric.

43. The method of claim 42, wherein generating the offset value further comprises generating a predetermined offset value responsive to the tool health metric being less than a predetermined threshold.

44. The method of claim 42, wherein generating the offset value further comprises generating the offset value having a magnitude proportionate to a difference between the tool health metric and a predetermined threshold.

45. The method of claim 35, wherein generating the feedforward control action further comprises generating an offset value for the measured output characteristic based on the tool health metric.

46. The method of claim 45, wherein generating the offset value further comprises generating a predetermined offset value responsive to the tool health metric being less than a predetermined threshold.

47. The method of claim 45, wherein generating the offset value further comprises generating the offset value having a magnitude proportionate to a difference between the tool health metric and a predetermined threshold.

48. The method of claim 45, wherein generating the tool health metric further comprises:

collecting tool state trace data during the processing of the second workpiece;

generating the tool health metric based on the tool state trace data; and generating the offset value based on the tool health metric.

49. The method of claim 48, wherein generating the offset value further comprises:

comparing the collected tool state trace data to a library of reference tool state traces, each reference tool state trace having an associated offset value;

selecting a reference tool state trace closest to the collected tool state trace data; and selecting the offset value associated with the selected reference tool state trace.

50. The method of claim 36, wherein generating the control action further comprises:

ignoring the measured output characteristic; and setting the operating recipe parameter to a default value.

* * * * *